(12) United States Patent
Park et al.

(10) Patent No.: US 8,675,139 B2
(45) Date of Patent: Mar. 18, 2014

(54) EMBEDDED MEMORY DESIGN FOR LOW POWER VIDEO PROCESSOR

(75) Inventors: Jongsun Park, Seoul (KR); Jinmo Kwon, Daegu (KR)

(73) Assignee: Korea University Research and Business Foundation (KR)

(*) Notice: Subject to any disclaimer, the term of this patent is extended or adjusted under 35 U.S.C. 154(b) by 0 days.

(21) Appl. No.: 13/339,798

(22) Filed: Dec. 29, 2011

(65) Prior Publication Data

US 2012/0236206 A1   Sep. 20, 2012

(30) Foreign Application Priority Data

Mar. 15, 2011   (KR) .................. 10-2011-0022706

(51) Int. Cl.
*H04N 7/18* (2006.01)
*G11C 8/00* (2006.01)
*A47F 5/12* (2006.01)

(52) U.S. Cl.
USPC ................... 348/714; 365/230; 711/171

(58) Field of Classification Search
USPC .............. 348/714–719, 552, 553; 345/531; 711/118, 119; 326/38, 39, 41, 47
See application file for complete search history.

(56) References Cited

U.S. PATENT DOCUMENTS 5,134,584 A * 7/1992 Boler et al. .................. 365/200
5,166,900 A * 11/1992 Kondo ..................... 365/185.11
5,398,210 A * 3/1995 Higuchi ................... 365/230.03
5,457,408 A * 10/1995 Leung ............................ 326/38
5,717,649 A * 2/1998 Kim et al. ................ 365/230.06
5,841,961 A * 11/1998 Kozaru et al. ................ 714/5.11
6,034,912 A * 3/2000 Isomura et al. ......... 365/230.03
6,295,594 B1 * 9/2001 Meier .......................... 711/171
6,418,061 B1 * 7/2002 Kitazaki ................. 365/185.29
6,697,294 B1 * 2/2004 Qi et al. ................... 365/210.15
7,123,510 B2 * 10/2006 Kojima et al. ........... 365/189.15
7,610,468 B2 * 10/2009 Madisetti ..................... 711/171
7,929,372 B2 * 4/2011 Han et al. ................ 365/230.06
7,996,647 B2 * 8/2011 Zdenek et al. ............... 711/202
8,225,042 B1 * 7/2012 Rudelic et al. ............... 711/118
2005/0180212 A1* 8/2005 Kojima et al. ........... 365/185.11
2010/0203728 A1* 8/2010 Nishiyama ................... 438/689
2011/0025699 A1* 2/2011 Ogawa .......................... 345/531

* cited by examiner

*Primary Examiner* — Paulos M Natnael
(74) *Attorney, Agent, or Firm* — Cantor Colburn LLP

(57) ABSTRACT

There is provided an image/video processor comprises an embedded memory for image/video data that including a plurality of unit memory blocks including a plurality of memory cells; and a controller configured to store each bit of image/video data received through an input/output unit in each memory cell, read the image/video data stored in each memory cell of the embedded memory, and output the image/video data through the input/output unit, wherein at least two or more memory cells included in the plurality of memory cells have different sizes, the controller assign each bit of the image/video data depending on the importance of the image/video data and a size of the memory cell, and as the size of the memory cell is larger, a bit of image/video data of high importance is assigned.

4 Claims, 8 Drawing Sheets

$W_0 \geq W_1 \geq \cdots \geq W_m$

EMBEDDED MEMORY DESIGN FOR LOW POWER VIDEO PROCESSOR

CROSS-REFERENCE TO RELATED APPLICATION

This application claims the benefit of Korean Patent Application No. 10-2011-0022706 filed on Mar. 15, 2011, the entire disclosures of which are incorporated herein by reference in their entirety.

FIELD OF THE INVENTION

The present disclosure relates to an embedded memory design for an image/video processor that requires low power consumption to process image or video data.

BACKGROUND OF THE INVENTION

Recently, as performance of a general purpose computer has been developed and a processing capability of mobile terminals has been improved, power consumption for processing multi-media data through mobile terminals has been keep increased. Regarding playing multi-media files, image/video processing techniques have been developed. In particular, video CODEC called as "MPEG or H.264" has been widely adopted due to its high image/video quality and high compression rate.

However, the image/video processing techniques require large amount of internal arithmetic operations and, thus, a high capacity memory is needed. Meanwhile, MPEG/H.264 technique for mobile devices, performance is restricted by battery life, and, thus, using the low supply voltage is widely used in order to reduce power consumption in an integrated circuit.

During a MPEG/H.264 arithmetic operation, when a supply voltage is decreased, malfunctioning in the data path can be prevented by reducing an operating frequency. However, as for a memory device for storing data for MPEG/H.264 arithmetic operations, a failure cannot be prevented by reducing an operating frequency.

Failure in reading and writing cells inside the embedded memory for image/video processor can be occurred when variation in process condition or a voltage or a temperature happens. If such a failure affects an output data, deterioration in image quality of a video may occur.

In order to minimize such deterioration in image/video quality in low supply voltage operation, a method of using eight or ten transistors instead of six transistors for 1 bit memory cell has been proposed. Also, a method of correcting errors in images/videos by using an error correction code has been suggested. These methods enable the embedded memory to be operated with a lower voltage but require a large circuit area or additional design costs.

Thus, a low cost technique is needed in order to prevent video quality from being deteriorated by the failure of the embedded memory even if an image/video processing circuit is operated with low operating frequency. Therefore, the present disclosure suggests an embedded memory design optimized for an image/video processing digital signal processing circuit.

BRIEF SUMMARY OF THE INVENTION

In some embodiments of the present disclosure, there are provided an image/video processor and its embedded memory design capable of minimizing deterioration in image/video quality even in a low voltage operation environment for reducing power consumption.

To minimize deterioration in image/video quality in a low voltage operation, the data priority difference between each image/video data can be exploited since the importance between each image/video data is different. Depending on importance of the image/video data, as the size of memory cell is larger, a bit of image/video data of high importance is assigned.

In view of the foregoing issues, in accordance with a first aspect of the present disclosure, there is provided an image/video processor comprises an embedded memory including a plurality of unit memory blocks including a plurality of memory cells; and a controller configured to store each bit of image/video data received through an input/output unit in each memory cell, read the image/video data stored in each memory cell of the embedded memory, and output the image/video data through the input/output unit, wherein at least two or more memory cells included in the plurality of memory cells have different sizes.

In accordance with one of the above-described aspects of the present disclosure, memory cells in a same word have different sizes and a memory cell having a large size stores data of high importance, so that the image/video quality degradation due to the memory failure which can be generated during a low supply voltage operation can be minimized. The above-described embedded memory configuration can give chance to lower down the supply voltage while maintaining same video quality. In particular, considering an increasing demand for processing image or video in mobile terminals in recent years, a mobile terminal having the embedded memory configuration that described in above can minimize power consumption.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
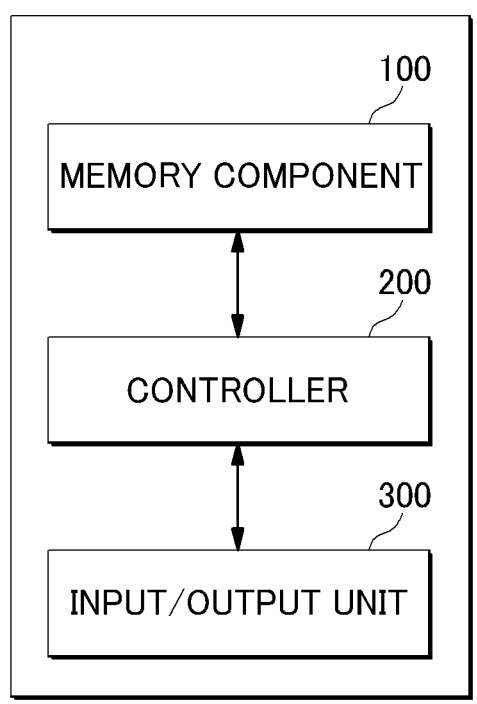
FIG. 1 shows an image/video processor in accordance with an embodiment of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be realized in various other ways. In the drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

FIG. 1 shows an image/video processor in accordance with an embodiment of the present disclosure.

An image/video processor 10 may include a memory component 100, a controller 200, and an input/output unit 300.

The memory component 100 for image/video processor may be configured such that cells included in the memory have different sizes. That is, a size of a cell in charge of each bit of inputted image/video processing data may vary according to an order of priority of the graphic processing data. By way of example, a size of a cell in charge of a bit of high priority may be larger than a size of a cell in charge of a bit of low priority. However, not every cell has a different size. Some memory cells may have the same size.

The image/video processor 10 that performs a MPEG/H.264 encoding operation may include a plurality memory component 100 or may use the memory component 100 divisively. By way of example, in the H.264 encoding operation, the image/video processor 10 may include a residual frame buffer, a reconstructed frame buffer, a reference frame buffer, and inter prediction buffer. Each buffer can be implemented by using the memory component 100 in accordance with an embodiment of the present disclosure. The memory component 100 may be embedded in the image/video processor 10.

Figure 2:
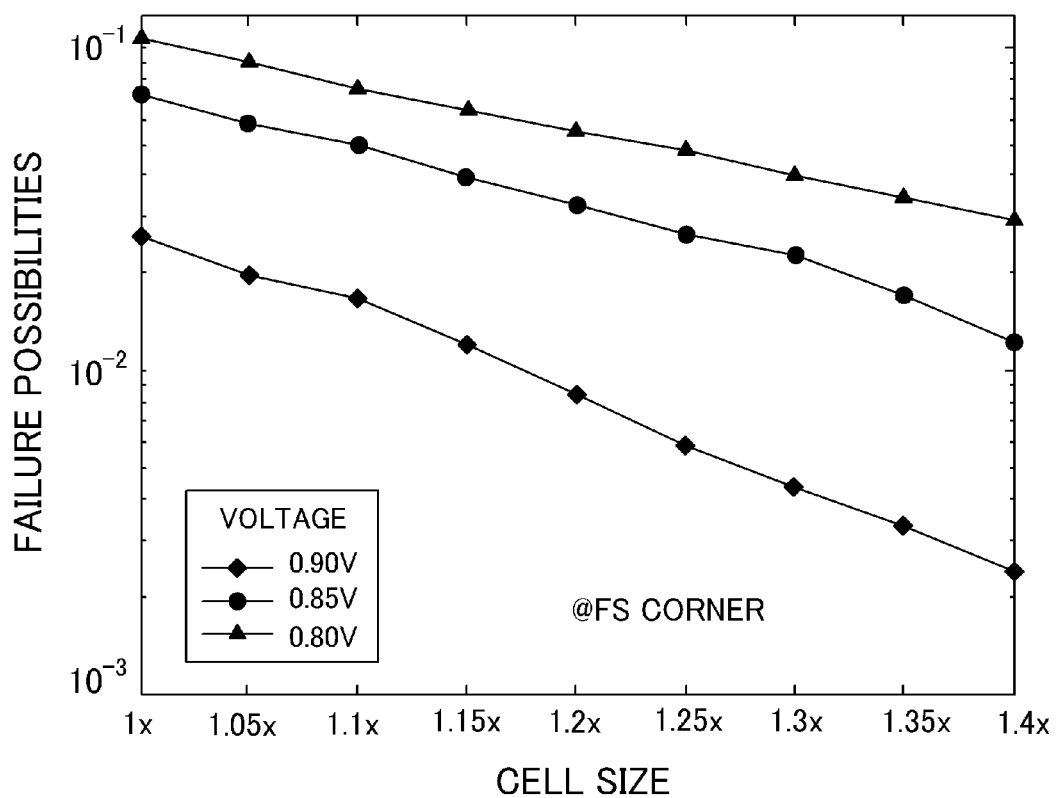
FIG. 2 is a graph for explaining a failure generated by an embedded memory used in a typical image/video processing apparatus.

FIG. 2 is a graph for explaining a relationship between the failure probability in the embedded memory and its unit size which used in a typical image/video processing apparatus.

Lowering the supply voltage (i.e. voltage scaling) is widely used to solve a problem of performance restriction that caused by battery life when a H.264 image/video processing technique is applied to a mobile terminal devices. However, if the supply voltage is lowered, a functional failure is likely to occur while image/video data in an embedded memory are accessed. It can be seen from the depicted graph that as a supply voltage is increased, a failure probability is decreased. Further, it can be seen that failure probability can be decreased as a size of memory cell is increases.

Accordingly, the present disclosure provides an embedded memory for image/video processor considering a relationship between a size of a memory cell and the failure probability. In accordance with a method of the present disclosure, even if a relatively low supply voltage is applied, a failure probability is greatly reduced with the larger size of memory cell.

Figure 3A:
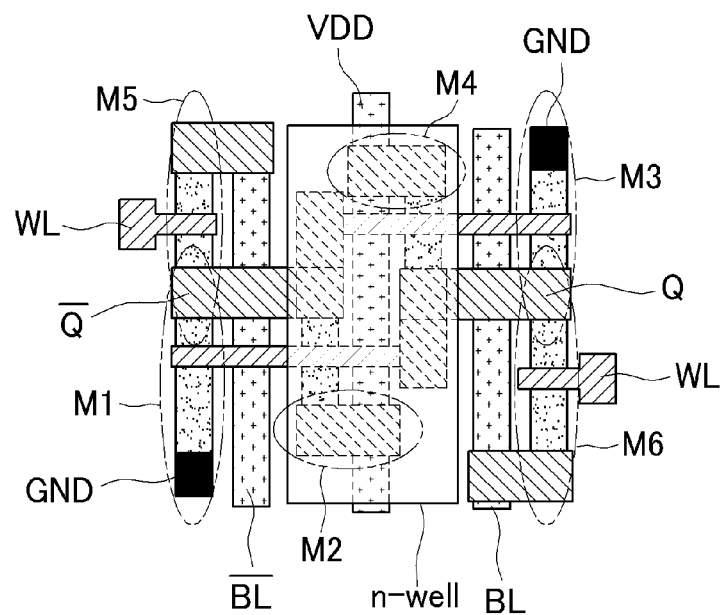
FIGS. 3a and 3b provide a detailed configuration of an embedded memory for image/video processor in accordance with an embodiment of the present disclosure.
Figure 3B:
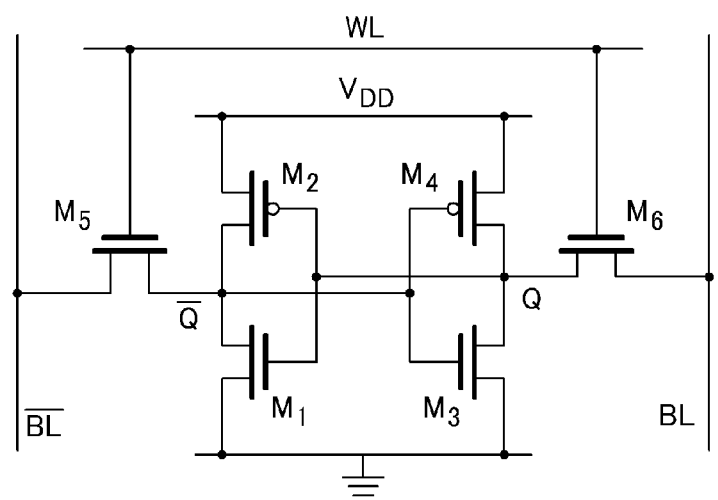

FIGS. 3a and 3b provide a detailed configuration of an embedded memory for image/video processor in accordance with an embodiment of the present disclosure.

FIG. 3a shows a layout of a unit memory cell and FIG. 3b is a circuit diagram showing a configuration of a unit memory cell.

A unit memory cell may include a total of six MOS transistors and each of the transistors may be connected to a word line WL, a bit line BL or a GND.

Each of a first MOS transistor M1, a second MOS transistor M2, a third MOS transistor M3, and a fourth MOS transistor M4 may form a CMOS inverter so as to store or maintain data of a first node Q and a second node /Q. That is, two inverters may be connected to be fed back to each other and may continuously store input data.

A fifth MOS transistor M5 and a sixth MOS transistor M6 may deliver data of a first bit line BL and data of a second bit line /BL to the first node Q and the second node /Q, respectively, in response to a signal applied through a word line.

FIG. 3a is a design view of a semiconductor for producing a configuration as depicted in FIG. 3b. FIG. 3a shows a layout of a total of six transistors and a connection status between a word line and a bit line.

Figure 4:
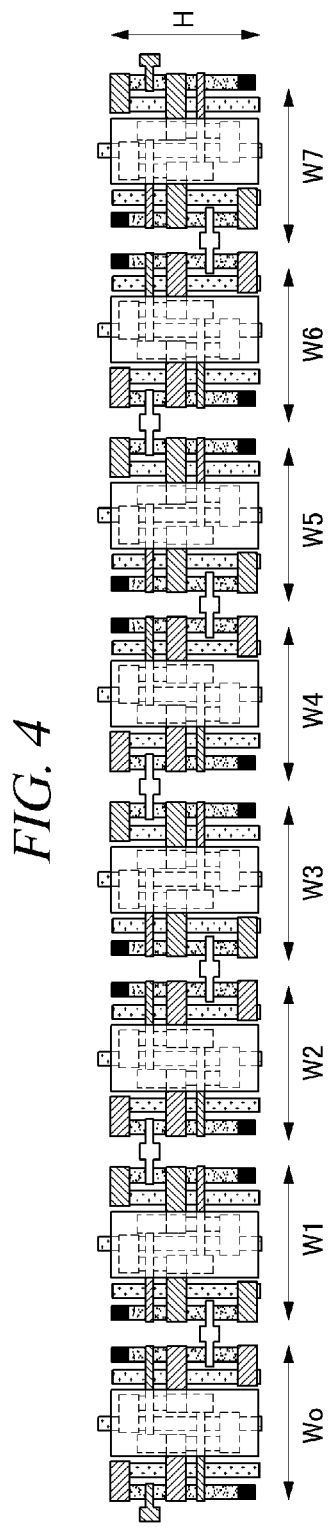
FIG. 4 shows a layout status of an embedded memory for image/video processor used in a conventional image/video processing apparatus.

FIG. 4 shows a layout status of an embedded memory for image/video processor used in a conventional image/video processing apparatus.

FIG. 4 shows a total of eight cells sharing a common word line, and a size of each cell is identical. In this case, all eight cells have same height and width. That is, same priority is assigned to total eight cells.

In the present disclosure, a PSNR (Peak Signal to Noise Ratio) index may be used to determine an order of priority of data.

The PSNR can be calculated by the following equation.

$$PSNR = 20 \cdot \log_{10}\left(\frac{255}{\sqrt{MSE}}\right) \qquad \text{[Equation 1]}$$

Herein, MSE is a difference between an original image and a degraded image and can be calculated by the following equation. In this case, the degraded image may be formed by a failure generated at a memory due to a low voltage supply.

$$MSE = \frac{1}{mn}\sum_{i=0}^{m-1}\sum_{j=0}^{n-1}[\text{Original}(i,j) - \text{Degraded}(i,j)]^2 \qquad \text{[Equation 2]}$$

As a result of an analysis, a calculated PSNR value may vary depending on a position of a failure generating memory cell.

Figure 5:
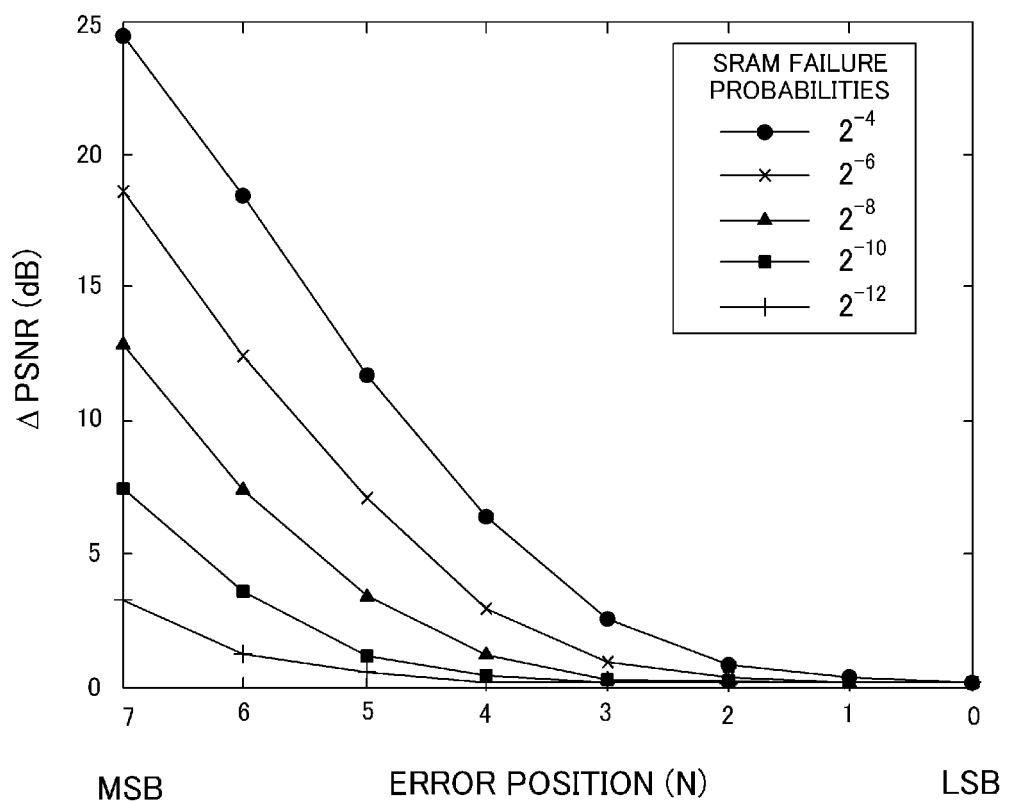
FIG. 5 is a graph for explaining a relationship between a position of a failure generating memory cell and a variation in a PSNR value.

FIG. 5 is a graph for explaining a relationship between a position of a failure generating memory cell and a variation in a PSNR value.

A PSNR variation (ΔPSNR) can be calculated by the following equation.

$$\Delta PSNR = PSNR_{original} - PSNR_{degraded} \qquad \text{[Equation 3]}$$

That is, the PSNR variation may be a difference between a PSNR of an original image and a PSNR of a degraded image.

It is found that one pixel data is consisting 8 bits, a PSNR variation of a most significant bit (MSB) is larger than a PSNR variation of a least significant bit. In particular, it can be seen that when a failure probability is increased by reducing a supply voltage, the PSNR variation of the most significant bit may be about 24~3 dB and the PSNR variation of the least significant bit may be about 1~0 dB.

The PSNR variation may vary depending on a position of a bit. Thus, as for a memory cell in charge of the most significant bit containing important data, its size may be increased so as to minimize a failure probability.

Figure 6:
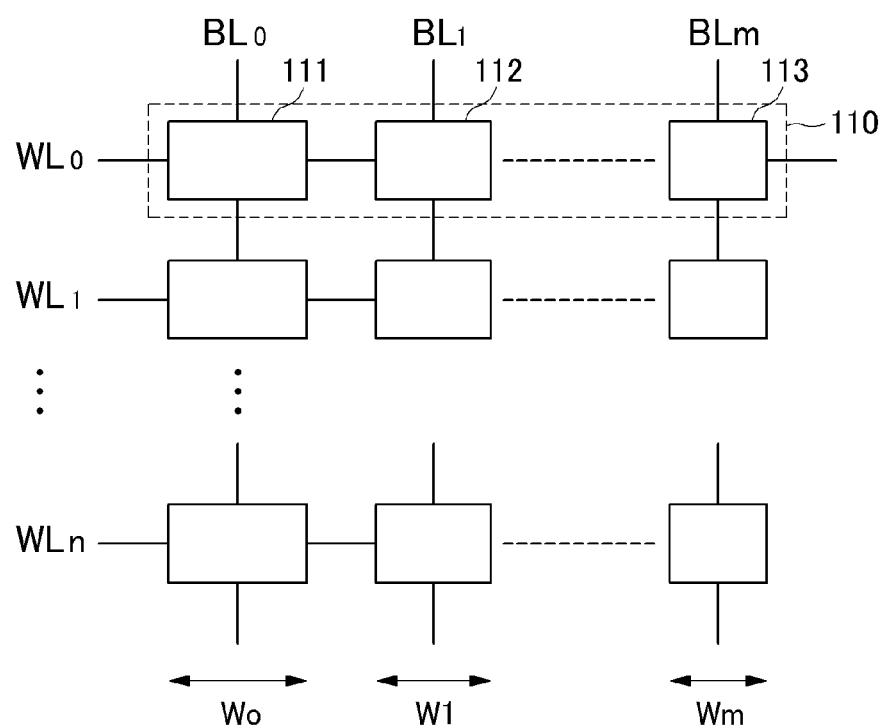
FIG. 6 shows an internal configuration of an embedded memory for an image/video processor in accordance with an embodiment of the present disclosure.

FIG. 6 shows an internal configuration of an embedded memory for image/video processor in accordance with an embodiment of the present disclosure.

A memory component 100 may include a plurality of memory blocks 110. Each of the memory blocks 110 may include a plurality of memory cells 111, 112 and 113 that stores image/video data of 1 pixel. By way of example, the memory block 110 may include eight memory cells that store image/video data of 1 pixel.

At least two or more memory cells 111, 112 and 113 included in the memory block 110 in accordance with the present disclosure may have different sizes. By way of example, memory cells sharing a common word line may have different widths but may have the same height.

The memory component 100 in accordance with the present disclosure can reduce a failure probability even in a low voltage operation due to a characteristic configuration provided in the present disclosure.

Returning to FIG. 1, the controller 200 may transmit image/video data inputted through the input/output unit 300 to the embedded memory 100. In this case, data of high priority is stored in a memory cell having a larger size among memory cells included in the embedded memory 100.

The image/video data may be organized based on data stored in the memory component 100 and may be outputted to the outside through the input/output unit 300.

The controller 200 may process the inputted image/video data based on a H.264 compression method or other image compression algorithms.

The input/output unit 300 may deliver data inputted from the outside to the controller 200 so as to store the inputted data in the memory component 100. Further, the input/output unit 300 may deliver the image/video data processed by the controller 200 to an external output apparatus such as a monitor so as to output the image/video data to the outside.

Figure 7:
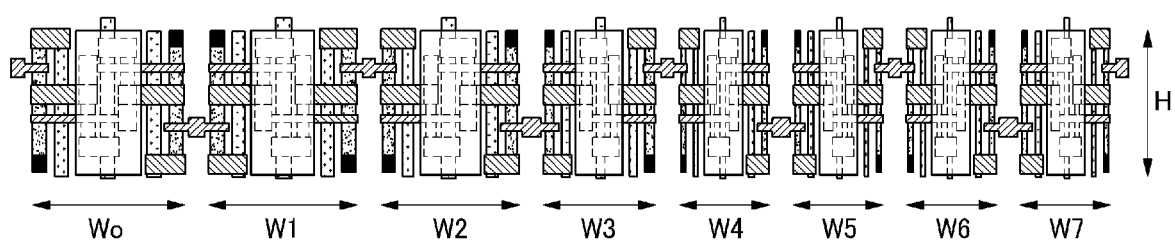
FIG. 7 shows a layout status of an embedded memory for image/video processor in accordance with an embodiment of the present disclosure.

FIG. 7 shows a layout status of an embedded memory for image/video processor in accordance with an embodiment of the present disclosure.

FIG. 7 shows a total of eight cells sharing a common word line, and a size of each cell may be different from each other. In this case, the eight cells may store unit data of 1 pixel.

Each cell may have the same height but may have a different width from each other. That is, a cell storing data of high priority may have a largest width W0 and a cell storing data of low priority may have a smallest width W7.

Figure 8:
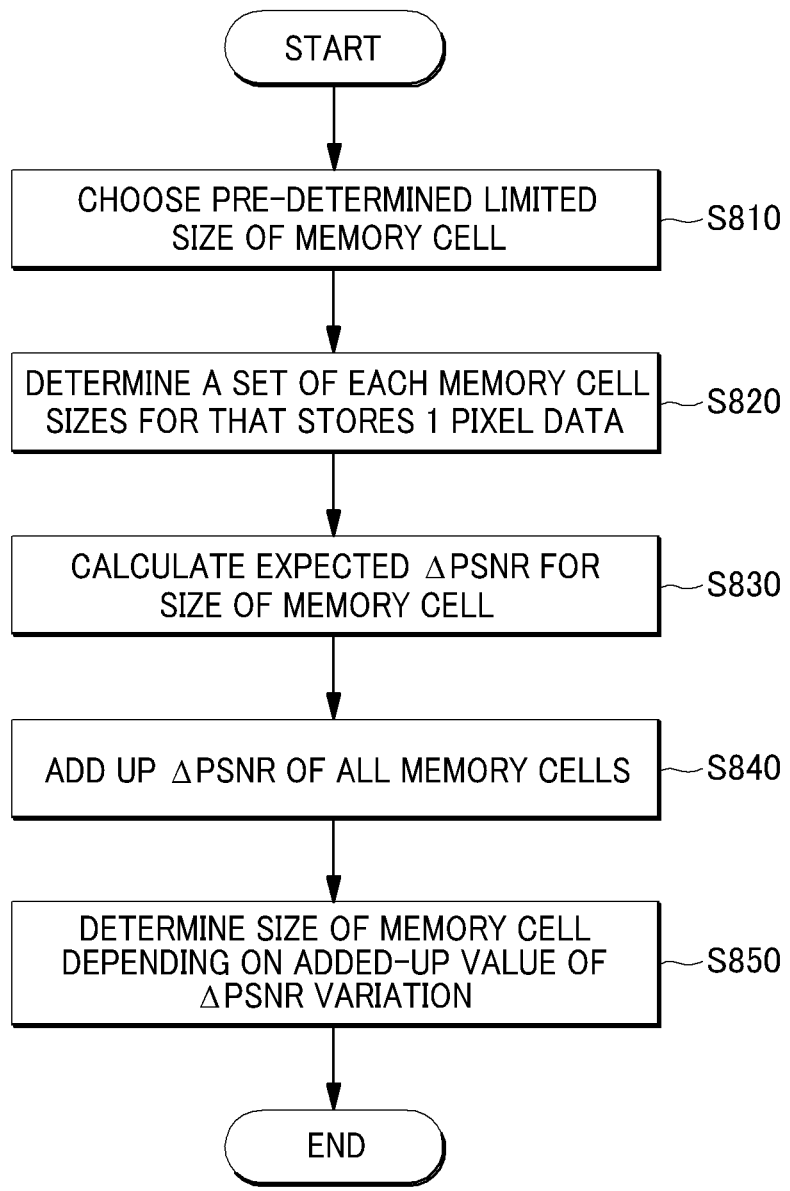
FIG. 8 is a flowchart showing a memory cell size determination method in accordance with an embodiment of the present disclosure.

FIG. 8 is a flowchart showing a memory cell size determination method in accordance with an embodiment of the present disclosure.

Above all, a pre-determined limited size of memory cells can be chosen (S810).

As an example, data of 8 bits may be required to take charge of 1 pixel data and a total of eight memory cells can be determined as a unit memory cell set for expressing 1 pixel data. A limited size of this unit memory cell set with respect to a total size thereof may be determined. That is, a size of each memory cell included in the unit memory cell set may be different from each other, but the sum of a size of each memory cell included in the unit memory cell set may be pre-determined.

Then, a set of each memory cell sizes for that stores 1 pixel data need to be determined (S820).

By way of example, a size of a memory cell in charge of a most significant bit may be larger than a size of a memory cell in charge of a least significant bit. Based on a pre-determined size of 8 memory cells for 1 pixel data, a size of each memory cell can be determined. In this case, the determined size of the memory cell may be changed in the following steps (S830 to S850).

Thereafter, an expected PSNR variation ($\Delta$PSNR) for a size of each memory cell may be calculated (S830).

A PSNR variation may be a pre-stored value in the form of a look-up table and can be calculated based on experimental data of an expected PSNR for a size of each memory cell. By way of example, experimental data of an expected PSNR calculated by inputting various image data to a memory including memory cells having different sizes may be collected and a PSNR corresponding to a size of each memory cell can be stored in a table.

Subsequently, a PSNR variation of each memory cell may be added up to calculate a PSNR variation of all memory cells (S840).

Then, depending on the sum of the PSNR variation for all eight bits in one pixel calculated in step S840, a size of a memory cell may be determined (S850).

Considering that when the PSNR variation of all memory cells is small, a failure probability may be low, it may be determined whether or not to change a size of a memory cell. By way of example, when a size of a cell in charge of a most signification bit is increased, if a PSNR variation of all memory cells is decreased, a size of the memory cell may be increased. In this case, a size of other memory cells included in the unit memory cell set needs to be decreased, and, thus, the PSNR variation can be changed.

An optimum size of a unit memory cell may be calculated by repeatedly performing the above-described steps S810 to S850.

Constituent components illustrated in FIG. 2 in accordance with the embodiment of the present disclosure may include software or hardware such as a field programmable gate array (FPGA) or an application specific integrated circuit (ASIC) and they function as pre-determined.

However, the constituent components are not limited to the software or the hardware, and each of the constituent components may be stored in an addressable storage medium or may be configured so as to implement one or more processors.

Accordingly, the constituent components may include, for example, software, object-oriented software, classes, tasks, processes, functions, attributes, procedures, sub-routines, and segments of program codes, drivers, firmware, micro codes, circuits, data, database, data structures, tables, arrays, variables or the like.

The constituent components and functions thereof can be combined with each other or can be divided.

The embodiment of the present disclosure can be embodied in a storage medium including instruction codes executable by a computer such as a program module executed by the computer. A computer readable medium can be any usable medium which can be accessed by the computer and includes all volatile/non-volatile and removable/non-removable media. Further, the computer readable medium may include all computer storage and communication media. The computer storage medium includes all volatile/non-volatile and removable/non-removable media embodied by a certain method or technology for storing information such as computer readable instruction code, a data structure, a program module or other data. The communication medium typically includes the computer readable instruction code, the data structure, the program module, or other data of a modulated data signal such as a carrier wave, or other transmission mechanism, and includes a certain information transmission medium.

The system and method of the present disclosure has been explained in relation to a specific embodiment, but its components or a part or all of its operation can be embodied by using a computer system having general-purpose hardware architecture or desirably, a digital signal processing system to which an order of priority can be applied.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

What is claimed is:

1. An image/video processor comprising: an embedded memory for image/video data including a plurality of unit memory blocks including a plurality of memory cells; and
   a controller configured to store each bit of image/video data received through an input/output unit in each memory cell, read the image/video data stored in each memory cell of the embedded memory, and output the image/video data through the input/output unit, wherein at least two or more memory cells included in the plurality of memory cells have different sizes,
   the controller assigns each bit of the image/video data depending on importance of the image/video data and a size of the memory cell, and as the size of the memory cell gets larger, a bit of image/video data with high importance is assigned.

2. The image/video processor of claim 1,
   wherein the memory cells included in the memory blocks have a same height and different widths.

3. The image/video processor of claim 1,
   wherein the controller assigns data of a most significant bit from a unit data set of the image/video data received through the input/output unit to a memory cell having a large size in the unit memory blocks.

4. The image/video processor of claim 1,
   wherein the embedded memory component is operated in a low supply voltage.

* * * * *